United States Patent [19]
Rockwell et al.

[11] 4,399,400
[45] Aug. 16, 1983

[54] APPARATUS FOR TESTING MULTICONDUCTOR CABLES AND HAVING TRANSITION CIRCUIT MEANS FOR EXTENDING ITS CAPABILITY

[75] Inventors: Kenneth N. Rockwell, Yorba Linda; Harold Minuskin, Tustin, both of Calif.

[73] Assignee: Cablescan, Inc., Orange, Calif.

[21] Appl. No.: 202,375

[22] Filed: Oct. 30, 1980

[51] Int. Cl.³ .................... G01R 31/02; G01R 19/00; G01R 15/12
[52] U.S. Cl. ........................................ 324/51; 324/66; 324/73 AT
[58] Field of Search ............ 324/51, 66, 73 R, 73 AT; 179/175.3 A, 175.3 F

[56] References Cited
U.S. PATENT DOCUMENTS

| 3,986,106 | 10/1976 | Shuck et al. | 324/66 |
| 4,224,690 | 9/1980 | Rockwell | 324/51 |
| 4,277,740 | 7/1981 | Parks | 324/51 |

Primary Examiner—Gerard R. Strecker
Assistant Examiner—Walter E. Snow
Attorney, Agent, or Firm—Robert M. McManigal

[57] ABSTRACT

A test system for evaluation of a terminated cable harness examines both the correctness of cable conductor connections and the correctness of the load circuitry to which the conductors are connected. Electrical continuity testing is employed for conductor layout evaluation and transition circuitry is introduced between the continuity tester and the cable to accommodate parametric evaluation of the load circuitry.

8 Claims, 4 Drawing Figures

APPARATUS FOR TESTING MULTICONDUCTOR CABLES AND HAVING TRANSITION CIRCUIT MEANS FOR EXTENDING ITS CAPABILITY

FIELD OF THE INVENTION

This invention relates generally to electrical test apparatus and pertains more particularly to cable harness test equipment having testing capability beyond the checking of electrical continuity.

BACKGROUND OF THE INVENTION

In U.S. Pat. No. 4,257,002 and commonly-assigned herewith, an electrical continuity tester is described of type generally addressed by the subject application. Such tester is adapted for receiving a known-good multiconductor harness and has microprocessor capabilities for examining the known-good harness and for storing electrical continuity characteristics thereof, such as continuity existing between the terminals of connectors on opposite ends of the cable. The tester further includes the capability for accepting input data from a recording medium, such as a tape cassette, which stored information may identify the electrical continuity characteristics of a harness.

Among the component parts of the referenced continuity tester are a console panel having a mode select switch, by which one may direct operation of the tester in the various modes, a microprocessing unit (MPU), a read only memory (ROM), which fixedly stores the instructions under which the tester operates, a random access memory (RAM), which stores the information either derived from the known-good harness or cassette tape and a scanning unit which examines the electrical characteristics of harnesses connected to the tester for evaluation and correspondence with the stored infomation. Display circuitry provides indication to the user of the tester of various sorts, inclusive of an identification of electrical continuity characteristics of the test cable which are in disagreement with the corresponding stored characteristics.

While the referenced tester fully meets the needs of cable harness evaluation wherein the confirmation of "shorts" and "opens" is sufficient, various applications arise in which more expansive test capability is needed. For example, where harnesses are for automotive use and terminate in circuitry having resistors, diodes, lamps and the like and where testing is desired of both the cables and the connected circuitry, the referenced tester falls short of the test requirements. While one can segregate the test procedure to obtain the benefits of the referenced automated tester for cable continuity evaluation, the supplemental circuitry testing would be performed at vastly slower rates through additional test equipment not coordinated with the referenced tester under common microprocessor control.

SUMMARY OF THE INVENTION

The present invention has as its object the expansion of the testing capability of electrical test equipment of the foregoing type.

In attaining the foregoing and other objects, the invention integrates with the referenced tester transition circuit means for adapting such equipment to the evaluation of electrical characteristics beyond electrical continuity. In a preferred system embodiment for resistance evaluation, the transition circuit means functions on program call out to compare sensed resistance against a predetermined resistance and then to return to the system a signal having characteristic common with that provided to the system in its customary electrical continuity testing. For lamp testing, the transition circuit means may include first circuit operative on program call out to energize the lamp and second circuitry for sensing lamp performance and returning such common characteristic signal to the system.

The foregoing and other objects and features of the invention will be further evident from the following detailed description of such preferred embodiment and from the drawings wherein like reference numerals identify like parts throughout.

DETAILED DESCRIPTION OF PREFERRED EMBODIMENTS

Figure 1:
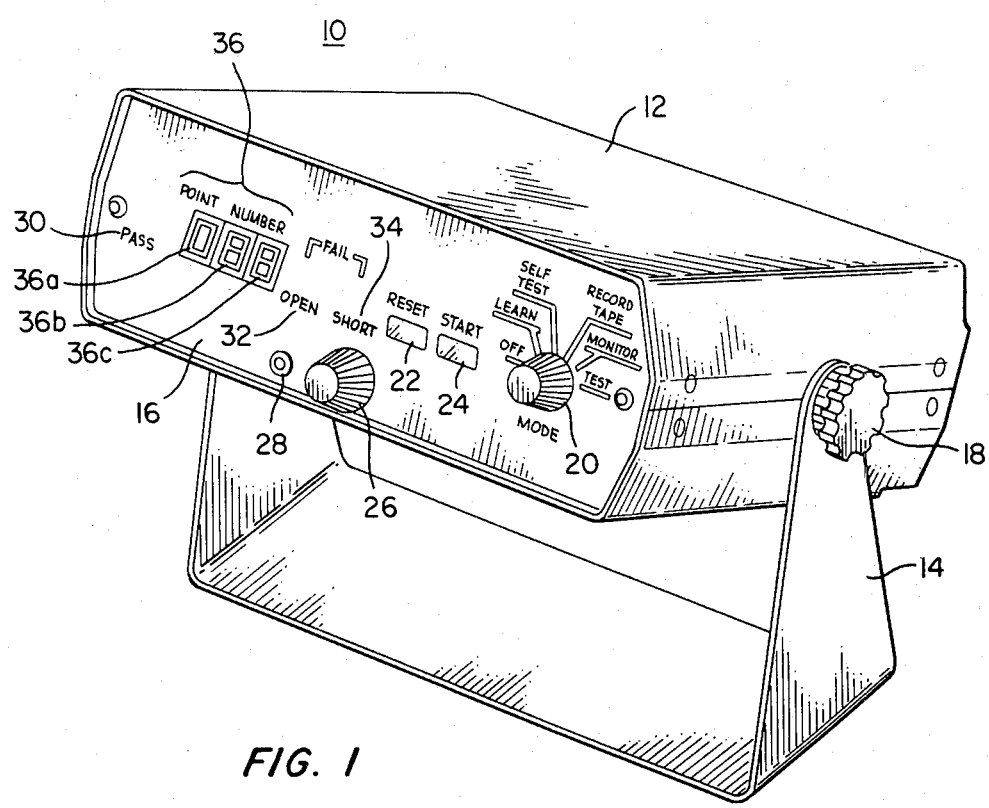
FIG. 1 is a perspective view of equipment embodying a portion of the system of the invention.
Figure 2:
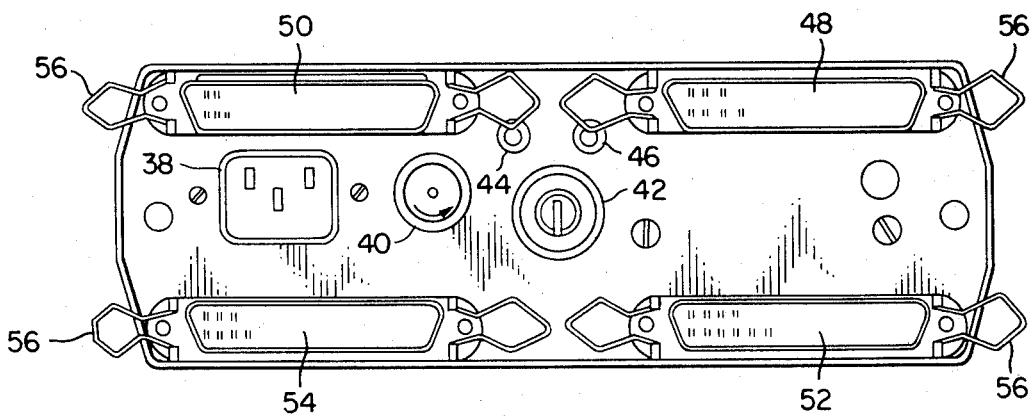
FIG. 2 is an elevational view of the rear panel of the equipment shown in FIG. 1.

Referring to FIGS. 1 and 2, apparatus 10 is comprised of a housing 12 swingably supported upon a stand 14 to enable adjustment of the front panel 16 to suit the viewing convenience of the operator. Once housing 12 is oriented relative to stand 14, locking knobs 18 may be tightened to retain the angular orientation of the housing.

The front control panel is provided with a manually operable control knob 20 adapted to be rotatably moved between a plurality of positions identified as OFF, LEARN, SELF TEST, RECORD TAPE, MONITOR and TEST.

Reset push button 22 is provided for resetting the unit following the completion of a test. The start push button 24 serves to initiate operation of the equipment when control knob 20 is set to the LEARN mode; is used to start a tape recording operation when the control knob 20 is set to the RECORD TAPE mode; and is further used to start a new test which may either be the first test of a series or may be the test to be performed after a reset operation.

Manually operable control knob 26 provides volume control for both the internal speaker and the earphones connected through phone jack 28.

The visual display for the system consists of light sources, which are preferably light emitting diodes (LED's) for indicating certain conditions. LED 30 is illuminated to indicate a successful test when control knob 20 is set to the TEST mode; to indicate the conclusion of learning of a known-good harness and storage of the interconnections in the memory when the control knob 20 is set to the LEARN mode; and to indicate successful completion of a record sequence when control knob 20 is set to the RECORD TAPE mode.

THE OPEN LED 32 serves to indicate when an erroneous OPEN condition has been detected. SHORT LED 34 is illuminated when an erroneous short or continuity condition is detected. The illumination of either LED 32 or 34 constitutes a failure condition.

A point number display 36 is comprised of three display digits 36a, 36b, and 36c, capable of displaying any point number from 000 through 999. The display is arranged to display both points under test with the numbers of these points being displayed sequentially and the lower number being displayed first. The display is activated only in the case of a fault condition.

FIG. 2 shows the rear panel of the apparatus shown in FIG. 1, which panel is provided with a three-prong plug 38 for coupling to a local source. A rotatable knob 40 covers the socket for receiving a fuse. A key switch 42 is adapted to receive a key, typically carried by only authorized personnel, for purposes of selectively enabling or disabling the LEARN and RESET switches. A tape-in phone jack 44 is provided for receiving the plug (not shown) of a tape recorder for purposes of playing a tape and transferring its contents to system memory. Tape-out phone jack 46 is used for receiving the interconnecting plug of a tape recorder for the purpose of transferring data stored in system memory to a tape cassette provided within the recorder.

In the embodiment described, four connector sockets 48–54 are provided for interconnection with connector plugs which may be releasably inserted within the connector sockets. In the embodiment described, herein, the sockets are of the fifty point type. For example, a wire harness having a connector plug compatible with the connector sockets 48–52 has one of such connector plugs inserted into connector socket 48, while the connector plug at its opposite end is inserted into socket 50, for example.

In the example given, the unit shown may actually test two harnesses simultaneously. For example, a single harness having end connectors with fifty terminal connections may have one end connector plugged into socket 48 and have its opposite end connector inserted into socket 52. A second harness may be similarly tested by inserting its connectors into sockets 50 and 54 of the unit. The swingable clips 56 serve to lock the connectors inserted into sockets 48–54 to prevent the units inserted therein from being dislodged or accidentally moved during a test routine.

Figure 3:
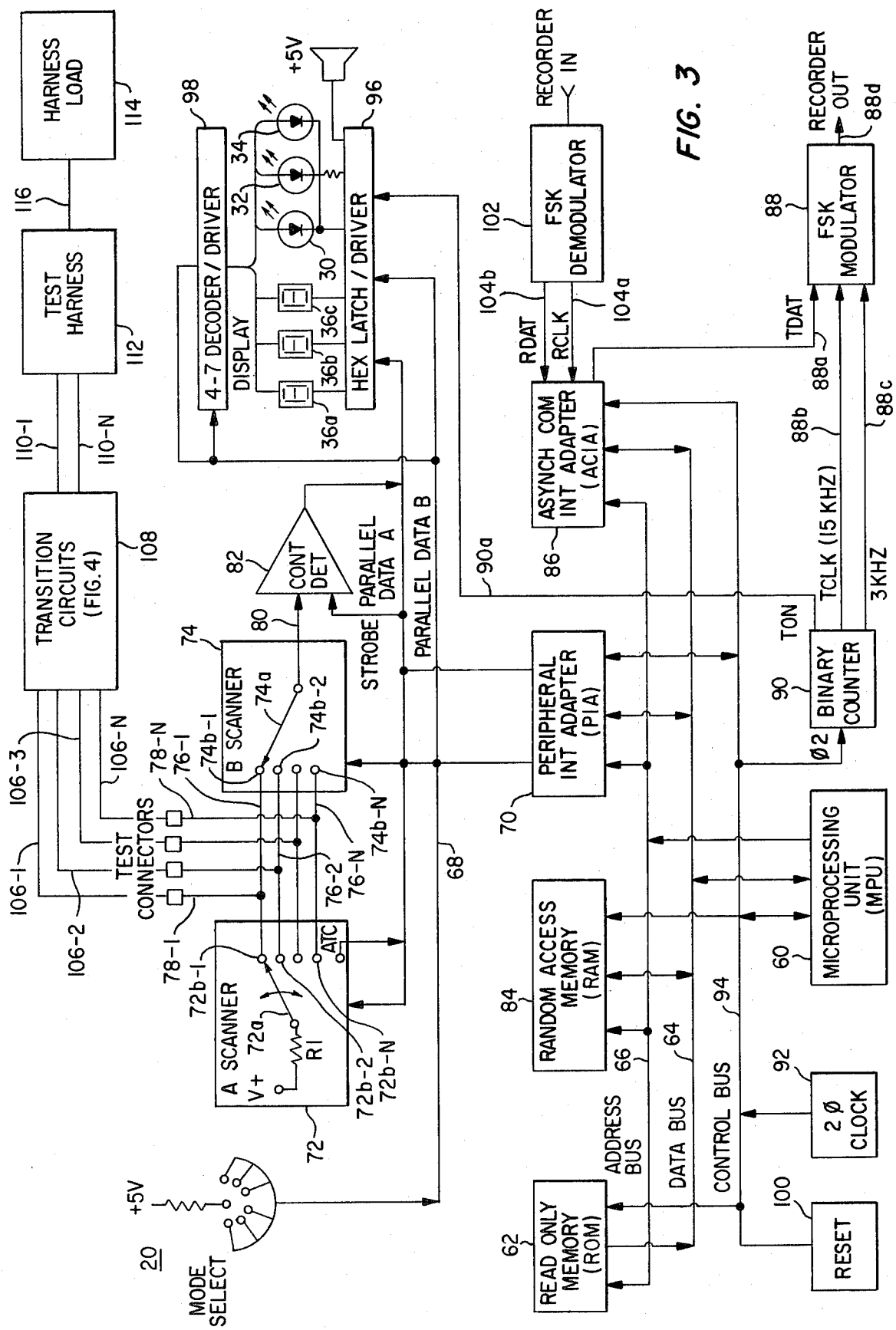
FIG. 3. is a block diagram of the control system of the FIG. 1 equipment expanded in accordance with the subject invention.

FIG. 3 shows a block diagram showing the components of the system of the reference patent, to which incorporating reference is hereby made. Such system is comprised of a microprocessing unit (MPU) 60 which controls the operation and order of operation of all of the system circuitry. MPU 60 operates in accordance with the program routines stored in read only memory (ROM) 62. ROM 62 interfaces with MPU 60 through data bus 64. Program steps are extracted in a non-destructive readout manner from ROM 62 and under control of MPU 60, through the address bus 66.

The mode select switch 20 conveys indication of its state, and hence the selected mode, to MPU 60 through the parallel data bus 68 and peripheral interface adapter (PIA) 70.

Test signals are applied to the points of the test connectors by means of "A" scanner 72 which is operated under control of MPU 60 through PIA 70. Electronic scanner 72 is represented as comprised of a movable scanning arm 72a electrically engageable with each of the scanner stationary contact points 72b-1 through 72b-N, the movable switch arm 72a being stepped from one stationary contact point to the next under control of MPU 60, the control signals being conveyed thereto through PIA 70. The "A" scanner functions to couple a DC voltage source V+ to the contact point connected thereto and through a current limiting resistor R1. In the example given in FIG. 1, for a two hundred point device, "A" scanner 72 would be provided with a total of two hundred stationary contact points.

"A" scanner 72 is operated in conjunction with a "B" scanner 74 represented rotary switch arm 74a which is incrementally stepped under control of PIA 70 to selectively engage each of the stationary contact points 74b-1 through 74b-N. Like numbered points of "B" scanner 74 are directly electrically connected through conductive leads to the like numbered points of "A" scanner 72 as shown. For example, point 72b-1 is connected to point 74b-1 by conductive lead 76-1; points 72b-2 and 74b-2 are connected by conductive lead 76-2, and so forth. In the example shown in FIG. 2, it should be understood that each scanner would be provided with two hundred points, and the points would be interconnected in the manner shown through the provision of two hundred lines, i.e., lines 76-1 through 76-200. Each of the lines is provided with branch conductors 78-1 through 78-N respectively, which couple each of the connecting lines to a like numbered point of the sockets at the rear panel of the unit (FIG. 2).

The "B" scanner switch arm 74a is coupled through lead 80 to one input of continuity detector 82 which may be a comparator developing an output signal when a voltage level is present at its input lead 80 (i.e., derived from the voltage source V+) and a strobe pulse is applied to its remaining input. This signal is coupled through PIA 70 to MPU 60 in order to initiate either a storage or a comparison operation, depending upon the operating mode to which the system is set. The "A" scanner 72 is preferably comprised of a discrete printed circuit board which includes integrated circuit chips sufficient for scanning one hundred points. The final point of the system, identified as ATC within "A" scanner 72, serves to provide an indication that the entire board has been scanned in order to advise MPU 60 of the fact that the first board has been scanned. This information is useful in the event that the system utilizes two such boards to indicate to MPU 60 that the first board has been scanned and that the second board should now be scanned.

The interconnections established by a known-good harness may be entered into the system by means of a LEARN routine in which data is entered into the random access memory (RAM) 84 to store the appropriate interconnections. In the event that it is desired to provide a facility remote from the location of the subject unit without the need for shipping an actual known-good harness, the system provides means for transferring data from RAM 84 through a non-destructive readout technique into a conventional cassette tape of the type employed in inexpensive tape recorders. Thus, the data may be recorded into the tape cassette, the tape cassette may be shipped to the remote facility, and its contents then read into a unit at the remote facility for the purpose of testing similar harnesses at said remote location. As another alternative, the data transferred to the tape cassette may be transmitted through a wire or wireless carrier having a frequency range capable of handling signals of the order of 3 kHz. In order to accomplish this result, MPU 60 sequentially reads the data in RAM 84 on a work-by-word basis, into the asynchronous communications interface adapter (ACIA) 86, which serves to convert the binary word, whose bits are presented thereto in parallel form, to serial form, each binary bit being sequentially applied to one input of a frequency shift keyed (FSK) modulator 88. The FSK modulator transmits either one of two frequencies applied to its input 88b, and 88c from a binary counter 90, the selection of the frequency to be transferred to the recorder at output 88d being determined by the binary level applied at input 88a.

The system timing is derived from a two-phase clock 92 applied to all of the circuits connected to control bus 94. One phase of the two-phase clock is coupled to binary counter 90 which serves to divide down the frequency rate and provide a 1.5 kHz signal on line 88b and 3 kHz on line 88c, as well as a higher frequency signal which is applied to the latch driver circuit 96 forming part of the display and display control circuitry. The three segmented display elements 36a, 36b and 36c are coupled between decoder driver circuit 98 and latch/driver circuit 96. Decoder driver circuit 98 controls the segments within each display unit 36a, 36b and 36c to be illuminated, as well as controlling which of the LED's 30, 32 and 34 are to be illuminated. The latch driver circuitry, in accordance with the frequency signal derived from binary counter 90 through line 90a serves to operate the display units in a multiplexed fashion so that even though the units are operated in an intermittent manner the rate of flashing of the units is so rapid as to appear to the human eye to be a steady on condition.

The reset circuits 100 couple the operating switches at the front and rear panels to the circuits coupled to control bus 94 to perform resetting operations.

In the record tape mode, the unit has the capability of receiving data representing the electrical interconnections of a known standard harness, which information has previously been stored in a tape cassette, for example in the manner described hereinabove. The data, which has been stored in the form of two discrete frequency states, is derived from the recorder and applied to a frequency shifted key (FSK) demodulator 12. Demodulator 102 functions to convert each of the frequencies into respective binary levels and to drive a clock from the higher of the two frequencies for synchronization purposes. The synchronization clock is outputted onto the R CLK line 104a to be applied to ACIA 86, while the data is placed upon the R DAT line 104b. The data is applied to ACIA 86 in serial fashion and is converted to parallel form. The format of the data transmitted from memory to a tape, as well as being received from a tape to be transmitted to memory, is in eleven-bit data format. The first bit of the eleven-bit is the start bit which is always binary "0." This bit is followed by an eight-bit data word with the least significant bit (LSB) immediately following the start bit, and with the most significant bit (MSB) being the last of the data word bits to be transmitted. The most significant for testing and thereby assuring the accuracy of the data, and the last bit of the eleven-bit data format is a stop bit which is always in the binary "1" state. In the embodiment being described, the binary "0" bit is a 3 kHz signal, while the binary "1" bit is a 1.5 kHz signal.

The incoming frequency shift-keyed data is thus converted into binary form and is fed in serial fashion to ACIA 86 which loads the serial data bits into a register, develops a parity bit independently of the parity bit carried by the eleven-bit data word, and compares the internally generated parity bit with the received parity bit to assure the accuracy of the received data word. Presuming the word to be correctly received, it is then transferred in parallel fashion to the appropriate location in RAM 84.

The sytem thus far discussed is covered in further detail in the referenced U.S. patent application, which shows various circuit details and describes operation thereof. The several component parts are preferably of type commercially available and discussed and described in a publication of Motorola Semiconductor Products Inc., entitled "M6800 Microcomputer System Design Data." Thus, MPU 60 may be the M6800 Microprocessing Unit. ROM 62 may be the MCM6830A ROM. RAM 84 may be the MCM6810A RAM. PIA 70 may be the MC6820 (or 21) PIA. ACIA 86 may be the MC6850 ACIA. In TEST mode, the system thus far described would, with "A" scanner contact arm 72a engaging contact 72b-1, apply the V+ voltage to line 78-1 to the cable under test. Assuming "B" scanner contact arm 74a engaging contact 74b-N, the V+ voltage will be conducted to continuity detector 82 only in the event that a test cable conductor extends in series circuit, i.e., is electrically continuous, between lines 78-1 and 78-N. Conversely, when the V+ voltage is not presented to detector 82, no conductor is in series between lines 78-1 and 78-N. These conditions, respectively "short" and "open," are correlated with contents of RAM 84 for the points involved to provide display indication in the event of disagreement between the examined and stored indications. The return from the cable to the test system of the V+ voltage, i.e., the return of a signal having a common electrical characteristic with that applied to the cable as a system output, is fundamental to system test operation in determining disagreement.

In the expanded test capacity system of the invention, lines 106-1 through 106-N connect transition circuits 108 to the system of the referenced tester and lines 110-1 to 110-N connect transition circuits 108 to test cable harness 112 which is in turn connected to cable harness load 114 through lines 116. Such system expansion is introduced solely for testing beyond electrical continuity. In the case of electrical continuity testing itself, direct electrical connection is made between the test harness points and the system of the reference tester. As will now be discussed by way of example through particular transition circuitry shown in FIG. 4, provision is made for receptivity to microprocessor control, i.e., time slotting, of evaluation of harness load components and for return signal indication to the referenced system of signals compatible with customary operation thereof in electrical continuity testing.

Figure 4:
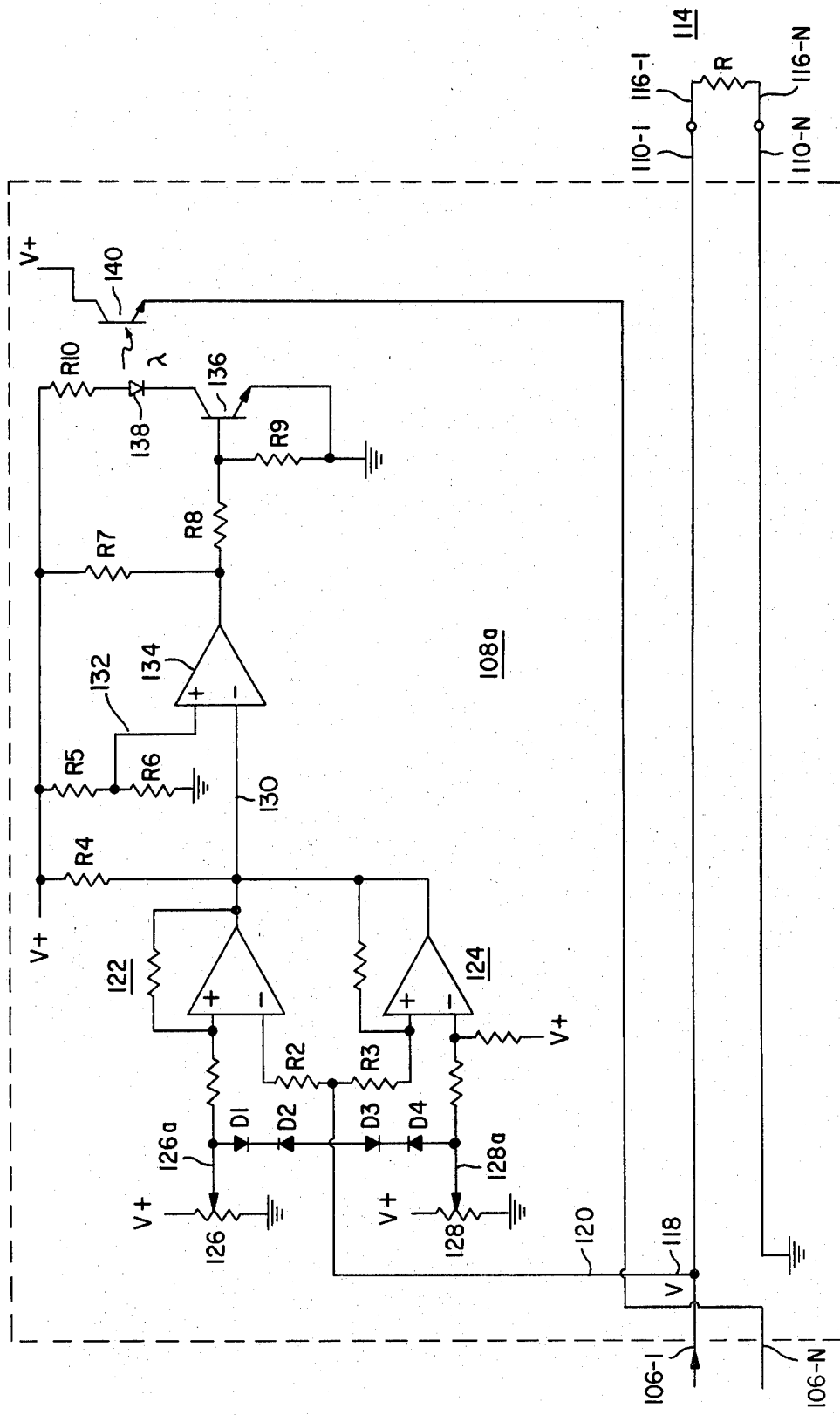
FIG. 4 is a schematic diagram of transition circuit means for cable load resistance evaluation.

Referring to FIG. 4, transition circuit 108a is connected to lines 106-1 and 106-N extending from the referenced tester and by lines 110-1 and 110-N to conductors 116-1 and 116-N of the test harness. The conductors have a resistor R connected as harness load 114. If the harness conductors are properly connected as noted and if the value of resistance seen in series therewith is of intended resistor R value, the signal returned to the referenced system should so indicate.

As "A" scanner arm 72a engages contact 72b-1 (FIG. 3), V+ voltage is applied to line 106-1, a voltage divider action occurs as between series-connected resistors R1 (FIG. 3) and harness load resistor R, giving rise to voltage level V, less than V+, on line 118. This voltage is conducted to the junction of resistors R2 and R3 and is applied to first inputs of differential operational amplifiers 122 and 124. The second inputs of amplifiers 122 and 124 are provided respectively by potentiometers 126 and 128, the former being set to define a voltage on wiper 126a for an acceptable high limit for resistance of harness load resistor R, and the latter being set to define a voltage on wiper 128a for an acceptable low limit of the harness load resistance. Diodes D1–D4 are connected back-to-back between the wipers.

Under conditions wherein voltage level V exceeds the voltage on wiper 126a or is less than the voltage on wiper 128a, line 130 is at a voltage level, established by resistor R4 and amplifiers 122 and 124, exceeding that on line 132, as established by resistors R5 and R6. Under these conditions, inverter 134 and resistors R7–R9 maintain transistor 136 nonconductive. LED 138 is inactive and coupled phototransistor 140 is nonconductive.

Conversely, where the harness resistance is within tolerance, voltage level V on line 120 exceeds that of wiper 128a and is less than that of wiper 126a. Line 132 voltage decreases and inverter 134 supplies an increased voltage level to transistor 136, rendering the transistor conductive. LED 138 now is energized through resistor R10 and phototransistor 140 is rendered conductive. Voltage level V+ is now available through phototransistor 140 on line 106-N for return to the referenced tester.

For purposes of correlating the FIG. 4 situation of which might be termed "parametric testing," i.e., evaluating the value of a parameter, with electrical continuity testing, let it be assumed that harness conductors 116-1 and 116-N were in fact to be connected to a common junction (shorted together). In this instance, the transition circuit would be omitted, line 106-1 would be directly connected to harness conductor 116-1 and line 106-N. Line 106-N is connected, as shown in FIG. 3, to detector 82, having input impedance vastly exceeding that of series resistor R (FIG. 3). The voltage level applied to detector 82 under electrical continuity test is thus essentially of level V+.

Transition circuit 108a will be seen to accommodate both a loading of the test signal (V+) on line 106-1 for resistance measurement and a return of full level signal (V+) to detector 82. Accordingly, the referenced tester is now made compatible with both parametric and short/open testing.

The invention contemplates the use of drivers within the transition circuit for applying power, as needed, in the course of harness load testing. By way of example, where the harness load is a lamp to be tested for lighting output, the signal furnished by "A" scanner 72 may operate a driver which furnishes filament power to the lamp. A photodetector positioned in the field of illumination senses lamp light output and may then operate a circuit such as shown at 136–140 of FIG. 4 to provide the return signal to the referenced tester.

In a further aspect of the invention, parametric test capability may be expanded to diode testing. Here, let it be assumed that a diode is connected as the harness load, its anode connected to harness conductor 116-1 and cathode to harness conductor 116-N in FIG. 3 in place of resistor R. Lines 106-1 and 106-N are connected directly to harness conductors 116-1 and 116-N and transition circuitry is omitted. The tester is now programmed so as to first apply V+ across lines 116-1 and 116-N, to examine the result (forward-biasing/short), and thereafter to apply V+ across lines 116-N and 116-1 (reverse-biasing/open). RAM 84 will contain corresponding comparison information by prior storage of harness connections, loads, etc. If either of the foregoing two tests result in disagreement with stored information, the diode is defective. If both of the two tests are in disagreement with stored information, the diode is not defective but is reversed from proper connection.

While the transition circuitry of FIG. 4 shows the switching transistor 140 connected to V+ directly at its collector, alternative connection may be made. Thus, if the collector were connected to line 106-1 instead of V+ and if line 110-N were not grounded as shown, but connected to line 106-N, voltage V at line 118 would decrease upon loading by resistor R. However, upon switching of transistor 140, the transistor would shunt resistor R, giving rise to V+ level voltage on line 106-N. In this instance, switches are connected selectively across loaded harness input end points such that the test signal is directly returned to the "B" scanner, as contrasted with its regeneration in the FIG. 4 arrangement. The foregoing and other modifications now will be evident to those skilled in the art.

The preferred embodiment is thus intended in an illustrative and not in a limiting sense. The true spirit and scope of the invention is set forth in the appended claims.

What is claimed is:

1. Apparatus for evaluation of electrical characteristics of a multiconductor cable having input and output end points and of electrical components connected to said output end points, said apparatus comprising:
   (a) storage means for storage of information indicative of circuit conditions required to exist between such cable input end points;
   (b) first scanning means for generating a test signal and applying same successively to said cable input end points;
   (c) second scanning means for communication successively with said cable input end points for receipt of said test signal therefrom;
   (d) detection means connected to said second scanning means and responsive to such received test signal for initiating comparison of circuit conditions existing between said cable input end points and such stored information with respect thereto; and
   (e) transition circuit means for connection to said first and second scanning means and those of said cable input end points having an electrical component connected to corresponding output points thereof, said transition circuit means being responsive to said test signal to determine if said component has a predetermined electrical characteristic and, upon such determination, to return said test signal to said second scanning means.

2. The apparatus claimed in claim 1 wherein said transition circuit means includes first circuit means receiving said test signal and thereupon determining such component characteristic, second circuit means for comparing said component characteristic with said predetermined characteristic and third circuit means responsive to said second circuit means for returning said test signal to said second scanning means.

3. The apparatus claimed in claim 2 wherein said third circuit means comprises a switch having said test signal applied thereto, said switch being operably responsive to said second circuit means.

4. The apparatus claimed in claim 2 wherein said electrical component is an electrical resistor and wherein said first circuit means generates a voltage indicative of the resistance of said component.

5. The apparatus claimed in claim 4 wherein said second circuit means includes a voltage comparator receiving such voltage indicative of component resistance and other voltage indicative of a predetermined resistance.

6. The apparatus claimed in claim 5 wherein said second circuit means includes means for generating first and second voltages indicative of low and high limits of predetermined resistance.

7. The apparatus claimed in claim 6 wherein said test signal has prescribed voltage level, said third circuit means comprising a switch having one terminal connected to a source of such prescribed voltage level and another terminal connected to said second scanning means.

8. Apparatus for evaluation of electrical characteristics of a multiconductor cable having input and output end points of electrical components connected to said output end points, said apparatus comprising:
 (a) storage means for storage of information indicative of circuit conditions required for exist between such cable input end points;
 (b) scanning means for generating a test signal having a prescribed voltage level and applying same to said cable input end points;
 (c) detection means connected to said scanning means and responsive to such received test signal for initiating comparison of circuit conditions existing between said cable input end points and such stored information with respect thereto; and
 (d) transition circuit means for connection to said scanning means and those of said cable input end points having an electrical resistor component connected to corresponding output points thereof, said transition circuit means being responsive to said test signal to determine if said component has a predetermined electrical resistance characteristic, and includes first circuit means for receiving said test signal and generating a voltage indicative of the resistance of said component, second circuit means including a voltage comparator for comparing the voltage indicative of said component resistance with a voltage indicative of said predetermined resistance, and means for generating first and second voltages indicative of low and high limits of said predetermined resistance, third circuit means responsive to said second circuit means for generating an output signal having a characteristic in common with said test signal and to apply said output signal to said scanning means, and including a switch having one terminal connected to a source of such prescribed voltage level and another terminal connected to said scanning means.

* * * * *